(12) United States Patent
Fujimoto

(10) Patent No.: US 7,827,431 B2
(45) Date of Patent: Nov. 2, 2010

(54) MEMORY CARD HAVING MEMORY DEVICE AND HOST APPARATUS ACCESSING MEMORY CARD

(75) Inventor: Akihisa Fujimoto, Yamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 614 days.

(21) Appl. No.: 11/862,741

(22) Filed: Sep. 27, 2007

(65) Prior Publication Data

US 2008/0098142 A1    Apr. 24, 2008

(30) Foreign Application Priority Data

Sep. 29, 2006  (JP)  ............................. 2006-269967

(51) Int. Cl.
  *G06F 1/06* (2006.01)
  *G06F 12/00* (2006.01)
  *G06F 13/14* (2006.01)
(52) U.S. Cl. .................. 713/501; 713/400; 713/401; 713/500; 713/502; 713/503; 713/600; 713/601; 710/15; 710/305; 711/101; 711/115
(58) Field of Classification Search ......... 713/400–401, 713/500–503, 600–601; 710/15, 305; 711/101, 711/115
See application file for complete search history.

(56) References Cited

U.S. PATENT DOCUMENTS

| | | | |
|---|---|---|---|
| 5,386,539 A | * | 1/1995 | Nishi ........................ 711/115 |
| 5,915,105 A | | 6/1999 | Farmwald et al. |
| 5,954,804 A | | 9/1999 | Farmwald et al. |
| 6,943,595 B2 | | 9/2005 | Sugimoto et al. |
| 6,971,582 B2 | * | 12/2005 | Kim ........................... 235/492 |
| 2003/0075609 A1 | * | 4/2003 | Kim ........................... 235/492 |
| 2004/0153582 A1 | * | 8/2004 | Oyama et al. .................. 710/15 |
| 2008/0034142 A1 | * | 2/2008 | Jo et al. ...................... 710/301 |
| 2008/0046775 A1 | * | 2/2008 | Chien ......................... 713/500 |

FOREIGN PATENT DOCUMENTS

JP   2003-196613   7/2003
JP   2004-120587   4/2004

OTHER PUBLICATIONS

U.S. Appl. No. 12/558,987, filed Sep. 14, 2009, Fujimoto.

* cited by examiner

*Primary Examiner*—Abdelmoniem Elamin
(74) *Attorney, Agent, or Firm*—Oblon, Spivak, McClelland, Maier & Neustadt, L.L.P.

(57) ABSTRACT

A memory card includes a clock I/O circuit, a data I/O circuit, a delay element, and an adjustment value holding circuit. The clock input/output circuit receives a first clock from a host apparatus. The data I/O circuit receives a second clock from the host apparatus in a write timing adjustment mode. The data I/O circuit transmits and receives data to and from the host apparatus in a data transfer mode. In the write timing adjustment mode, the delay element adjusts a phase of the second clock in accordance with the first clock so as to receive the data received in the data transfer mode in response to the first clock. The adjustment value holding circuit holds an adjustment value for the phase of the second clock adjusted. In the data transfer mode, the delay element adjusts a phase of the data in accordance with the adjustment value.

13 Claims, 6 Drawing Sheets

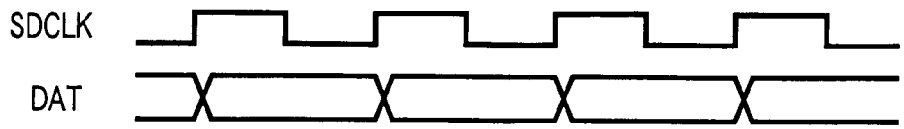
FIG. 3  SDR data transfer
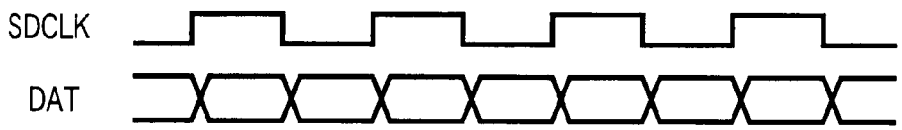
FIG. 4  DDR data transfer
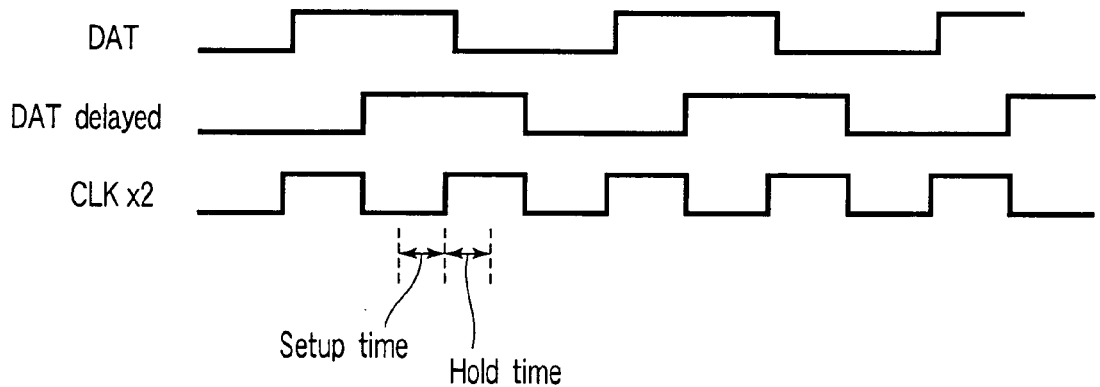
FIG. 6
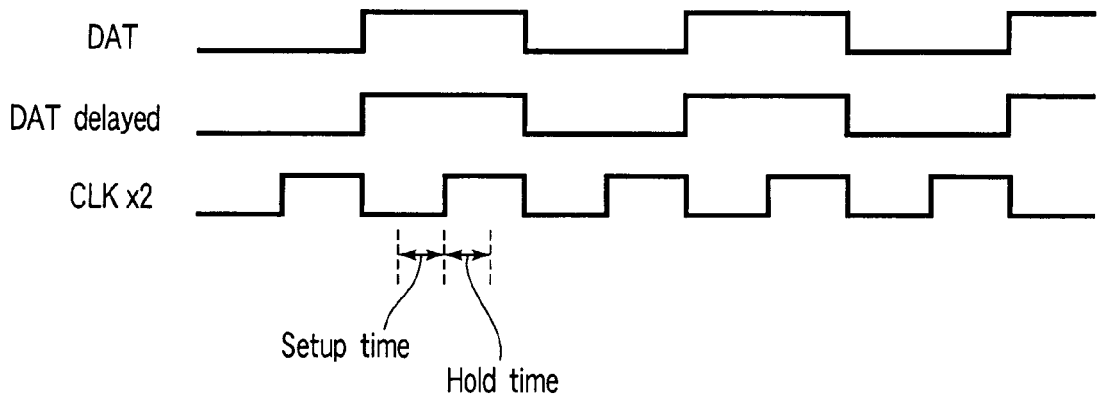
FIG. 9

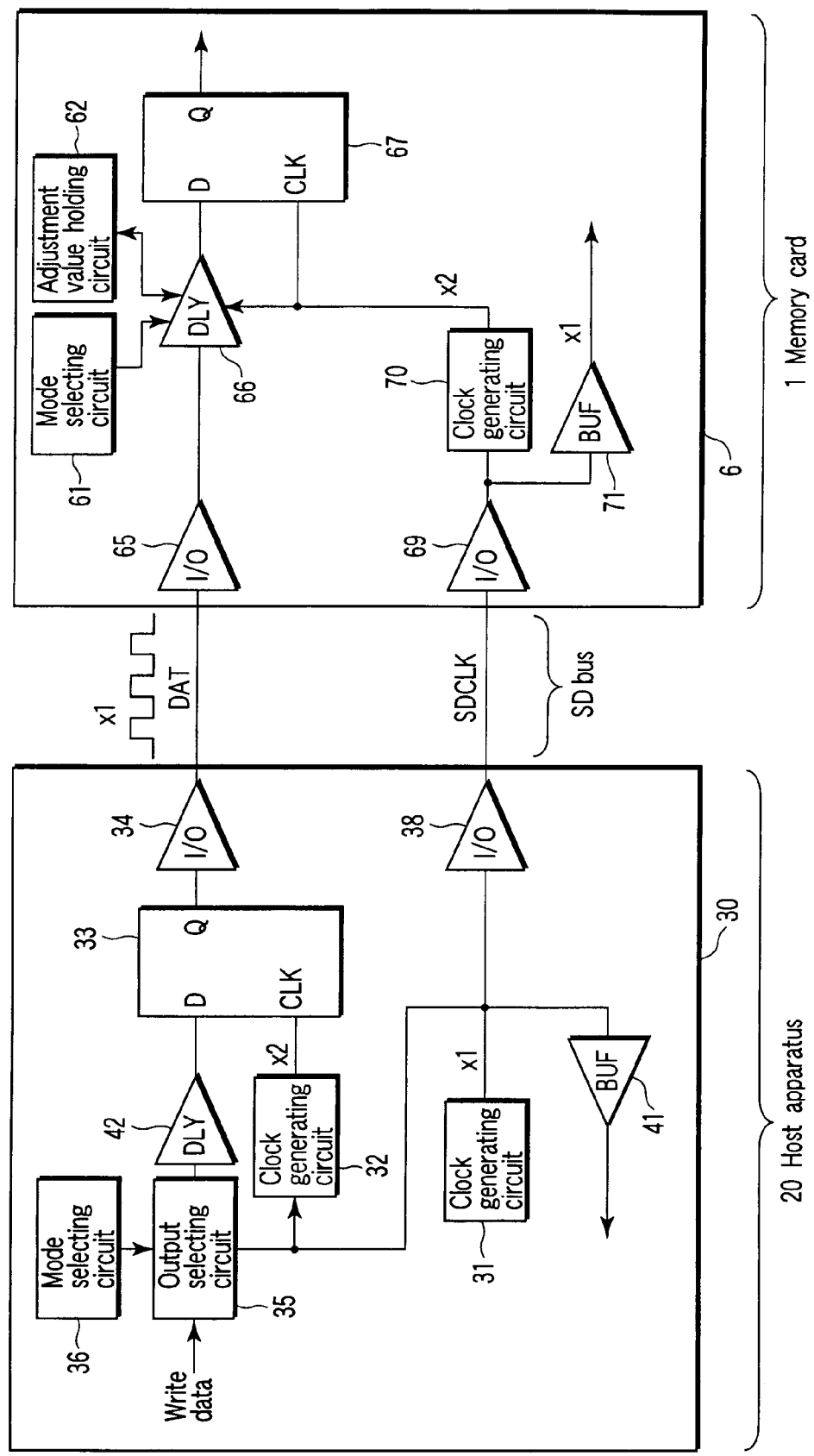
F I G. 5

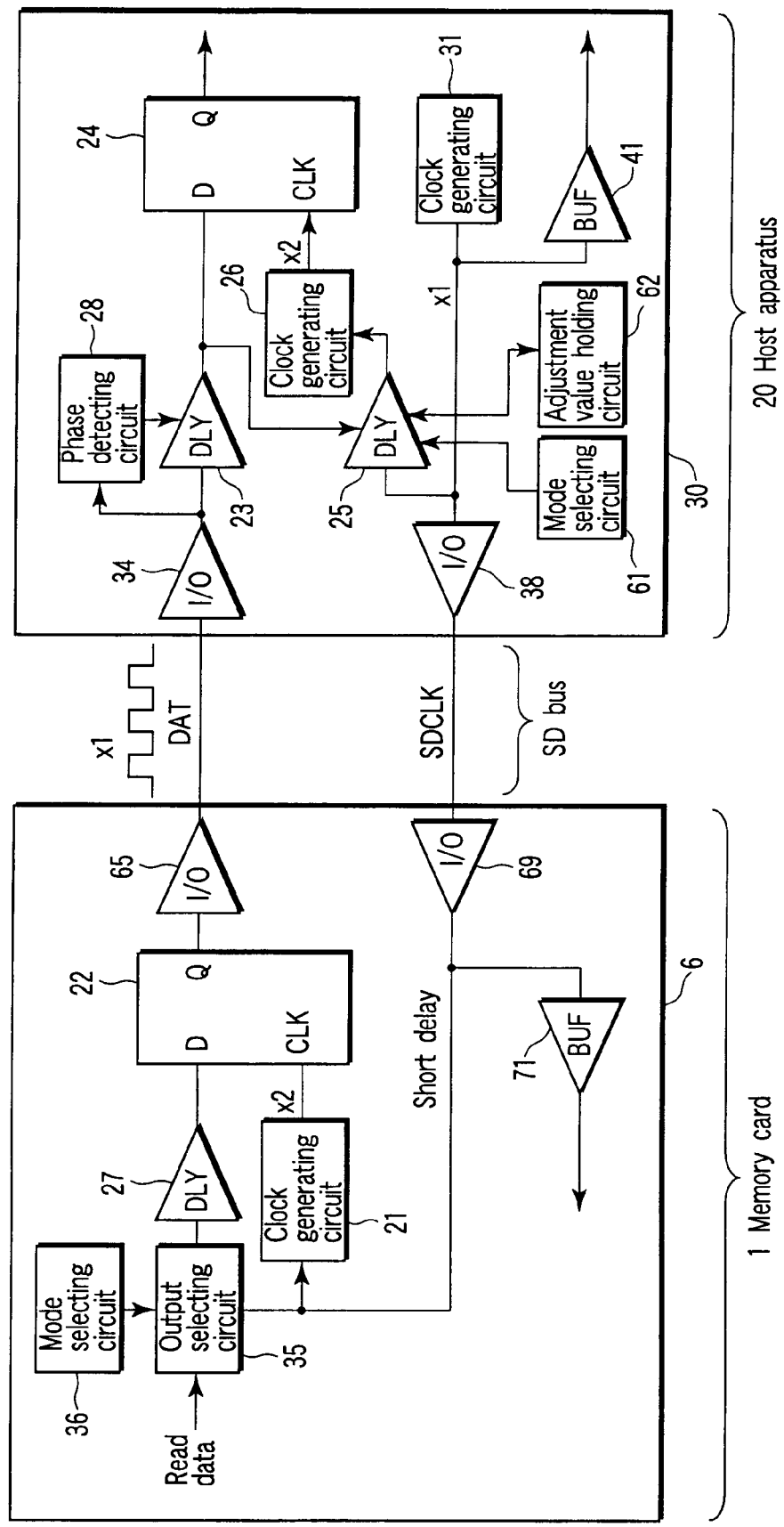
F I G. 8

MEMORY CARD HAVING MEMORY DEVICE AND HOST APPARATUS ACCESSING MEMORY CARD

CROSS-REFERENCE TO RELATED APPLICATIONS

This application is based upon and claims the benefit of priority from prior Japanese Patent Application No. 2006-269967, filed Sep. 29, 2006, the entire contents of which are incorporated herein by reference.

BACKGROUND OF THE INVENTION

1. Field of the Invention

The present invention relates to a memory card having a memory device on which a data write operation, a data read operation, and a data erase operation are performed in response to an access from a host apparatus, and also relates to the host apparatus. For example, the present invention relates to timing adjustment for a bus interface that connects the memory card and the host apparatus together.

2. Description of the Related Art

Memory cards such as SD memory cards, which are one type of removable memory devices, have often been used in various portable electronic apparatuses such as personal computers, PDAs, cameras, and cellular phones (see, for example, Jpn. Pat. Appln. KOKAI Publication No. 2003-196613). The SD memory card is able to transfer data at a maximum of 25 MB/sec owing to an expanded high speed mode. However, next-generation memory cards are desired to have a transfer ability equivalent to at least 50 MB/sec.

However, with bus interfaces used in memory cards and based on the current scheme, it is difficult to control operation timings owing to a variation in delay. This in turn makes it difficult to increase the frequency of clock signals used to synchronize operations. The timing and element properties depend on the implementations and combination of the memory card and a host system. This makes it impossible to pre-calculate a predetermined delay value. In this respect, the memory card is different from onboard DRAMs (Dynamic Random Access Memories) and the like.

BRIEF SUMMARY OF THE INVENTION

A first aspect of the present invention provides a memory card accessed by a host apparatus, the memory card comprising a clock input/output circuit which receives a first clock signal from the host apparatus via a clock line; a data I/O circuit which receives a second clock signal from the host apparatus via a data line in a write timing adjustment mode executed by the memory card, the data I/O circuit transmitting and receiving data to and from the host apparatus via the data line in a data transfer mode; a delay element which, in the write timing adjustment mode, adjusts a phase of the second clock signal output by the data I/O circuit in accordance with the first clock signal so as to receive the data received in the data transfer mode in response to the first clock signal supplied by the clock input/output circuit; and an adjustment value holding circuit which holds an adjustment value for the phase of the second clock signal adjusted by the delay element. In the data transfer mode, the delay element adjusts a phase of the data output by the data I/O circuit in accordance with the adjustment value held in the adjustment value holding circuit.

A second aspect of the present invention provides a host apparatus accessing a memory card, the host apparatus comprising a clock generating circuit which generates a first clock; a clock input/output circuit which supplies the first clock signal to the memory card via a clock line; a data I/O circuit which receives a second clock signal generated on the basis of the first clock signal, from the memory card via a data line in a read timing adjustment mode executed by the host apparatus, the data I/O circuit transmitting and receiving data to and from the memory card via the data line in a data transfer mode; a first delay element which, in the read timing adjustment mode, adjusts a phase of the first clock signal in accordance with the second clock signal output by the data I/O circuit; and an adjustment value holding circuit which holds an adjustment value for a phase of the first clock signal adjusted by the first delay element. In the data transfer mode, the first delay element adjusts the phase of the first clock generated by the clock generating circuit in accordance with the adjustment value held in the adjustment value holding circuit.

BRIEF DESCRIPTION OF THE SEVERAL VIEWS OF THE DRAWING

FIG. 3 is a timing chart showing data transfer based on a single data rate (SDR) scheme;

FIG. 4 is a timing chart showing data transfer based on a double data rate (DDR) scheme;

FIG. 5 is a diagram showing the configuration of the memory card and the host apparatus in accordance with the first embodiment;

FIG. 6 is a timing chart showing the case in which a delay element in accordance with the first element adjusts a clock pattern so as to shift the phase of the clock pattern from the phase of a clock signal by 180 degrees;

FIG. 8 is a block diagram showing the configuration of a memory card and a host apparatus in accordance with a second embodiment of the present invention; and FIG. 9 is a timing chart showing the case in which a delay element in accordance with the second element adjusts a clock pattern so as to shift the phase of the clock pattern from the phase of a clock signal by 180 degrees.

DETAILED DESCRIPTION OF THE INVENTION

Embodiments of the present invention will be described below with reference to the drawings. In the description below, the same parts are denoted by the same reference numbers throughout the drawings.

First Embodiment

First, description will be given of a memory card and a host apparatus in accordance with a first embodiment of the present invention.

Figure 1:
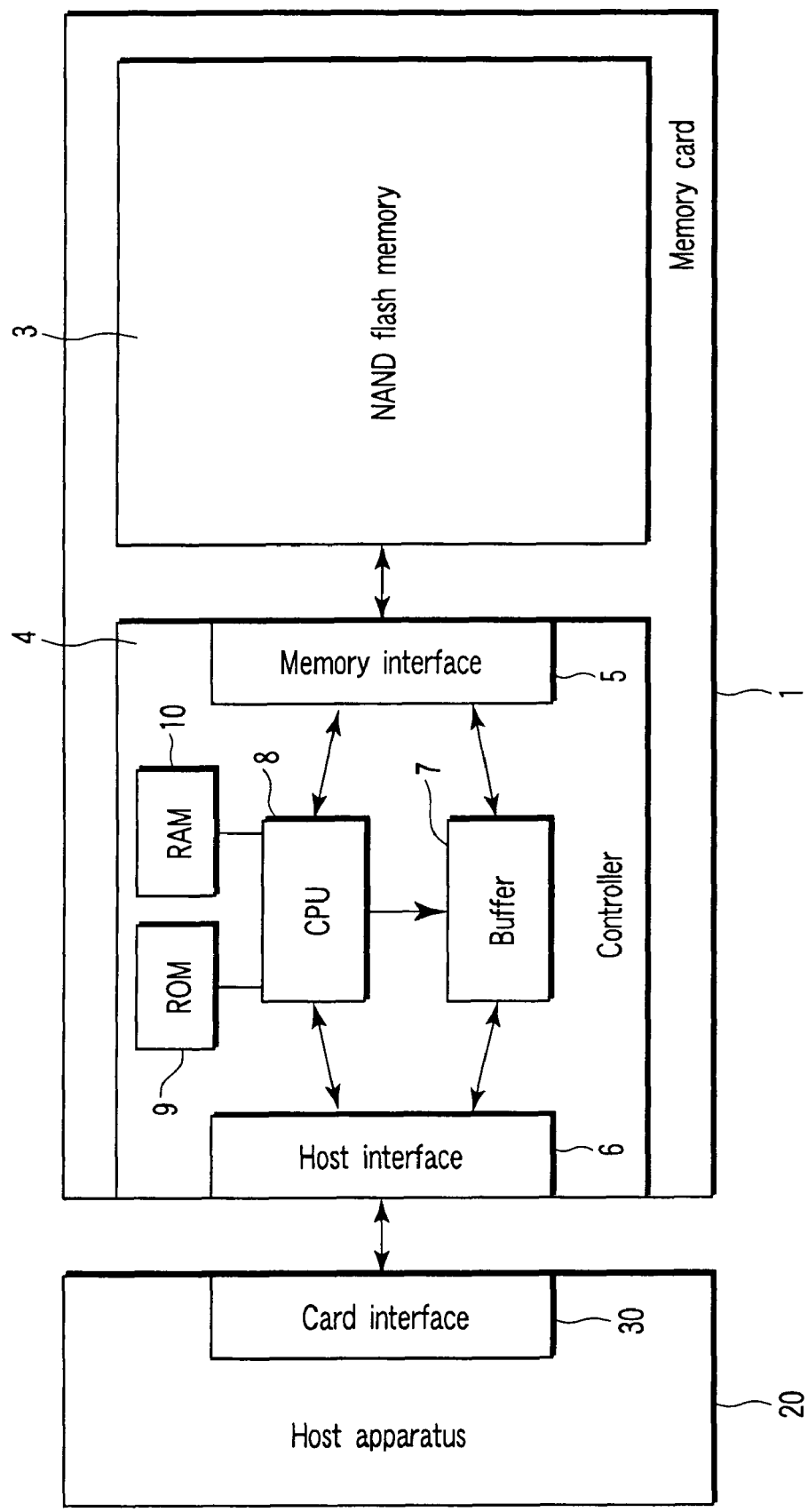
FIG. 1 is a block diagram showing the configuration of a memory card and a host apparatus in accordance with a first embodiment of the present invention.

FIG. 1 is a block diagram showing the configuration of the memory card and the host apparatus in accordance with the first embodiment of the present invention.

As shown in FIG. 1, the memory card 1 includes a semiconductor memory device, for example, a nonvolatile semiconductor memory device such as a NAND flash memory 3, and a controller 4. Functional blocks such as a central processing unit (CPU) 8 and read-only memory (ROM) 9 are mounted in the controller 4. The NAND flash memory 3 may be a binary memory in which 1-bit information is stored in one memory cell or a multivalue memory in which information corresponding to more than 1 bit (for example, 2 bits) is stored in one memory cell. Here, an example in which a NAND flash memory is used will be described. However, the present invention is not limited to this but is applicable to other nonvolatile semiconductor memories such as NOR memories.

Further, although not shown, the NAND flash memory 3 and the controller 4 may be arranged on a printed circuit board (PCB) or may be formed in the same large-scale integration (LSI) circuit.

When connected to the host apparatus 20, the memory card 1 is supplied with power to operate to execute a process corresponding to an access from the host apparatus 20. The memory card 1 has the NAND flash memory 3 and the controller 4 as described above.

The NAND flash memory 3 is a nonvolatile memory specified to have an erase block size (block size as an erase unit) of, for example, 256 bytes. The NAND flash memory 3 is also specified so that data is written to and read from the NAND flash memory 3, for example, in 2 Kbytes. The NAND flash memory 3 is produced using, for example, a 0.09-µm process technique. That is, the design rule for the NAND flash memory 3 is less than 0.1 µm.

In addition to CPU 8 and ROM 9, described above, the controller 4 includes a memory interface 5, a host interface 6, a buffer 7, and random access memory (RAM) 10. The memory interface 5 executes an interface process between the controller 4 and the NAND flash memory 3. The host interface 6 executes an interface process between the controller 4 and the host apparatus 20. A card interface 30 in the host apparatus 20 executes an interface process between the host apparatus 20 and the controller 4.

The card interface 30 and the host interface 6 will be shown and the data transfer between the interfaces will be described below.

Figure 2:
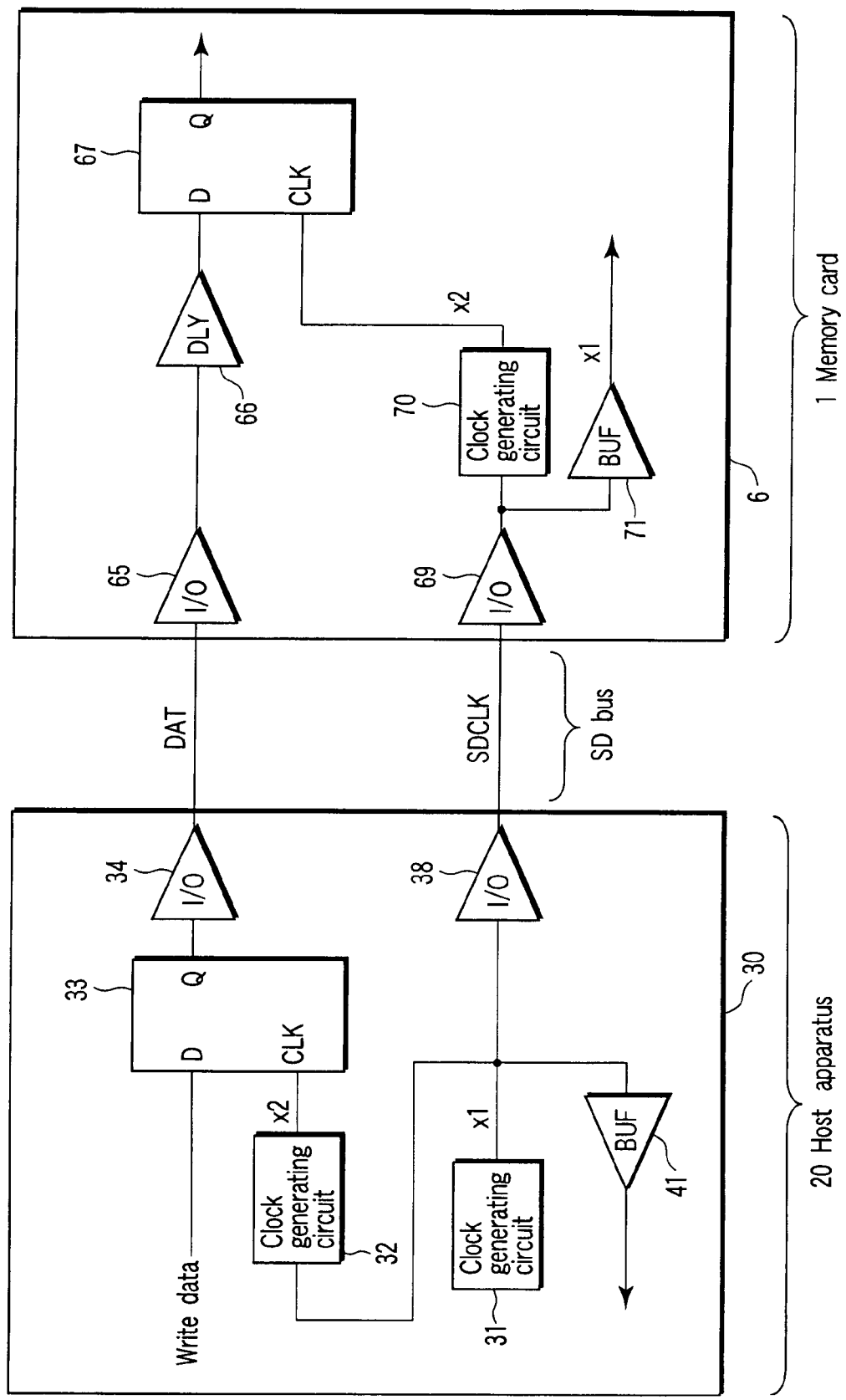
FIG. 2 is a diagram showing the configuration of a card interface in the host apparatus and a host interface in the memory card during a normal data transfer mode (data transfer from the host apparatus to the memory card)

FIG. 2 is a diagram showing the configuration of the card interface 30 in the host apparatus 20 and the host interface 6 in the memory card 1 during a normal data transfer mode (normal operation mode). FIG. 2 shows an example in which the host apparatus 20 transfers write data to the memory card 1. FIG. 2 also shows the connection relationship under which data held in a transmission flip flop 33 is output, transferred via data I/O circuits 34 and 65, and then held in a reception flip flop 67.

Clock generating circuits 32 and 70 output clock signals having a frequency that is an integer times, at least twice (in this case, twice), as large as that of a clock signal generated by the clock generating circuit 31. The clock generating circuits 32 and 70 are not necessarily essential in the present embodiment but are able to realize a double data transfer rate on a bus interface with the same number of signals as shown in FIGS. 3 and 4. With a double data rate (DDR) scheme, data DAT is transferred in half the period of a bus clock SDCLK. The clock generating circuits 32 and 70, which double the clock frequency, are used to internally control the data on the basis of one of the edges of the clock signal.

With an SD memory card, a bus clock is generated by the clock generating circuit 31 in the host apparatus 20 and supplied to the memory card 1 via a clock I/O circuit 38, a bus interface, and a clock I/O circuit 69. Therefore, the write data and the clock signal are transferred in the same direction, that is, from the host apparatus 20 (card interface 30) to the memory card 1 (host interface 6). When the host apparatus 20 receives data, the phase relationship between each data bit and the clock signal is important. Reception timings can be adjusted to some degree on the basis of the wiring length of a data line through which data is transmitted and of a clock line through which the clock signal is transmitted, or by using transistors having the same properties. However, since the connection between the memory card 1 and the host apparatus 20 cannot be identified, the reception timing depends on the implementation. It is thus expected that the delay varies among the data bits. The data I/O circuit cells 34 and 65 are bidirectional, but FIG. 2 shows only a part in which the data is transmitted from the host apparatus 20 to the memory card 1. A buffer circuit 41 supplies clock signals to the other circuits in the host apparatus 20. A buffer circuit 71 supplies clock signals to the other circuits in the memory card 1.

FIG. 2, described above, shows a configuration established during the normal data transfer mode. However, the memory card 1 and the host apparatus 20 in accordance with the embodiment of the present invention are characterized by further having an initialization mode including a write timing adjustment mode and a read timing adjustment mode. The initialization mode is executed when the power is turned on or every predetermined period. The write timing adjustment mode is a timing adjustment mode executed by the memory card (card timing adjustment mode). The read timing adjustment mode is a timing adjustment mode executed by the host apparatus (host timing adjustment mode).

FIG. 5 is a diagram showing the configuration of the memory card and the host apparatus in accordance with the first embodiment of the present invention. In the first embodiment, description will be given of the memory card and host apparatus having the write timing adjustment mode.

Differences from the configuration shown in FIG. 2 will be shown below. The delay element 42 and an output selecting circuit 35 are connected to an input terminal D of the flip flop 33 in the card interface 30 in the host apparatus 20. A mode selecting circuit 36 is connected to the output selecting circuit 35. The mode selecting circuit 36 outputs a signal required to set the write timing adjustment mode or the normal operation mode, to the output selecting mode 35. Upon receiving a signal setting the write timing adjustment mode from the mode selecting circuit 36, the output selecting circuit 35 outputs a clock signal generated by the clock generating circuit 31 to the delay element 42. Further, upon receiving a signal setting the normal operation mode, the output selecting circuit 35 outputs write data to the delay element 42. That is, in the write timing adjustment mode, the output selecting circuit 35 supplies the clock signal to the input terminal D of the data transmission flip flop 33 via the delay element 42 to allow a clock pattern to be output onto a data bus.

Moreover, a mode selecting circuit 61 and an adjustment value holding circuit 62 are connected to a delay element 66 in the host interface 6 in the memory card 1. Upon receiving the signal setting the write timing adjustment mode from the mode selecting circuit 61, the delay element 66 adjusts the phase of a clock pattern input to an input section of the delay element 66, that is, a delay value (adjustment value), so that the edge of a clock signal (a first clock signal) generated by the clock generating circuit 70 matches the edge of a clock pattern (a second clock signal) output by the data I/O circuit 65. At this time, the determined adjustment value is held in the adjustment value holding circuit 62. Upon receiving the signal setting the normal operation mode from the mode selecting circuit 61, the delay element 66 uses the adjustment value held in the adjustment value holding circuit 62 to adjust a delay value for write data input to the input section of the delay element 66. That is, in the write timing adjustment mode, a clock signal supplied to a clock terminal of the reception flip flop 67 is supplied to the phase adjustable delay element 66. On the basis of the clock signal, the delay element 66 adjusts the phase of the clock pattern to determine the current adjustment value. Moreover, the determined adjustment value is held in the adjustment value holding circuit 62. Then, in the normal operation mode, the delay element 66 adjusts the delay value for the write data in accordance with the adjustment value held in the adjustment value holding circuit 62. This makes it possible to ensure an appropriate setup and hold time for the reception flip flop 67.

In the write timing adjustment mode, the transmission flip flop 33 is supplied with a clock signal of a double frequency by the clock generating circuit 32. Consequently, such a waveform as shown in FIG. 5 is output onto the data bus. The phase adjustable delay element 66 has a function of adjusting the phase of the clock pattern output onto the data bus by the host apparatus 20 and the phase of the clock signal input to the reception flip flop 67, to particular values.

FIG. 6 shows a timing diagram showing the case in which the delay element 66 adjusts the clock pattern so as to shift the phase of the clock pattern by 180 degrees from the phase of the clock signal (CLK×2). The unadjusted clock pattern is a signal DAT and the adjusted clock pattern is a signal DAT Delayed. With the DDR scheme, the rising edge and falling edge of the signal DAT Delayed synchronize with data change points on the data bus during the data transfer mode. Thus, the signal DAT Delayed is adjusted so that the rising edge of the clock signal supplied to the reception flip flop 67 corresponds to the intermediate point between the data change points. In other words, the delay element 66 adjusts the phase of the signal DAT Delayed so that the setup and hold time for the edge of the clock signal supplied to the reception flip flop 67 is included in the period from the rising edge to falling edge of the signal DAT Delayed (or the period from the falling edge to the rising edge). This ensures a sufficient setup and hold time for the flip flop 67. Further, write data is made of data of a plurality of bits, and the phase adjustable delay element 66 is interposed into each of a plurality of data lines through which the respective data bits is transmitted. Also in this case, individual adjustment of the delay elements enables a variation in delay among the data lines or the bits to be adjusted. This ensures a sufficient setup and hold time for the individual flip flops 67. The delay values for the data in the data bus and for the clock signal in a clock bus are affected by a variation in environment such as temperature. Thus, a variation in environment and the like can be dealt with by periodically executing the initialization mode, including the write timing adjustment mode and the read timing adjustment mode, to readjust write and read timings.

Second Embodiment

Now, description will be given of a memory card and a host apparatus in accordance with a second embodiment. Arrangements similar to those in the first embodiment are denoted by the same reference numbers and will not be described below. The configuration of the memory card and host apparatus shown in FIG. 1 is similarly applicable to the second embodiment.

Figure 7:
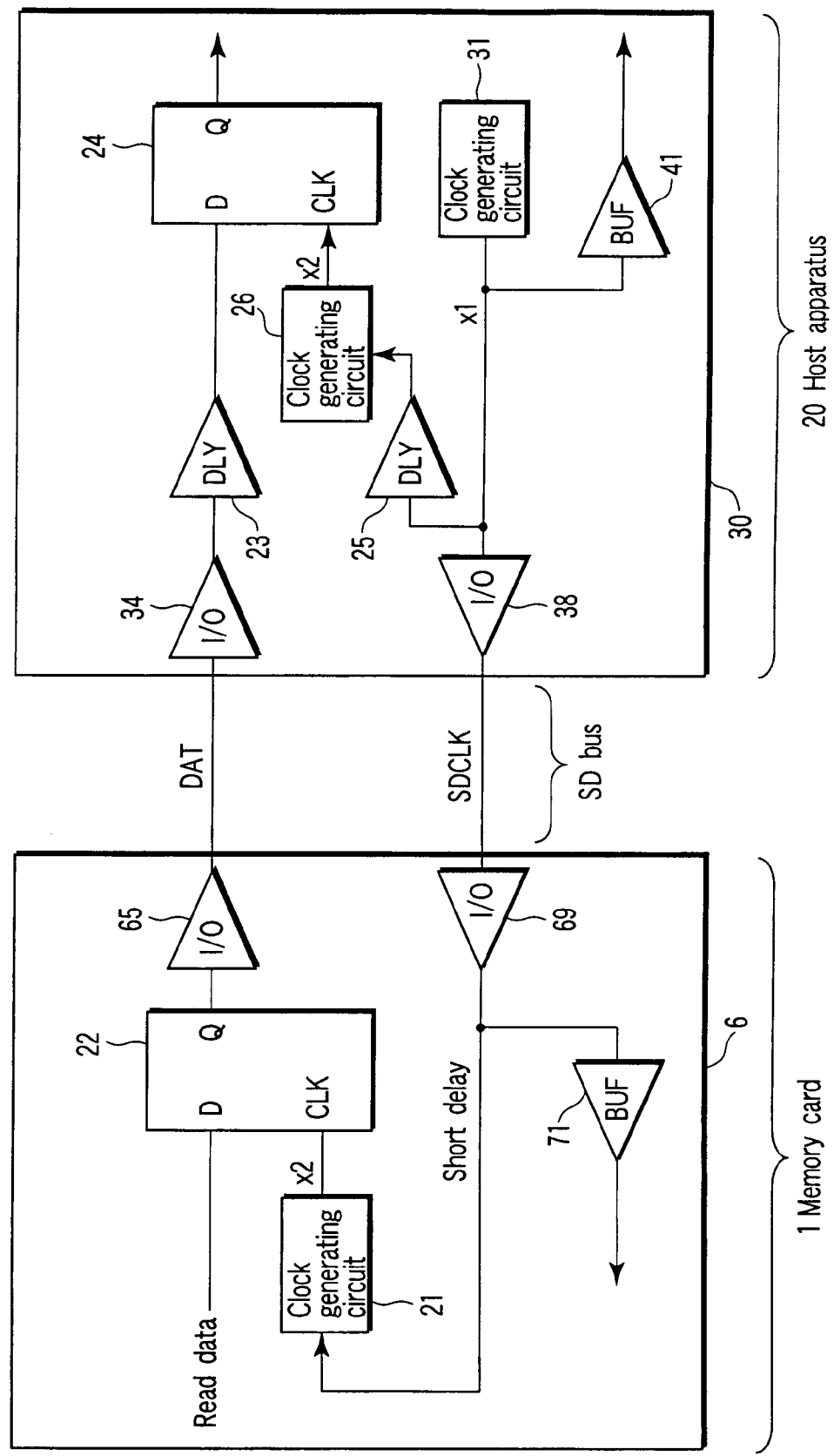
FIG. 7 is a diagram showing the configuration of the card interface in the host apparatus and the host interface in the memory card during the normal data transfer mode (data transfer from the memory card to the host apparatus)

FIG. 7 is a diagram showing the configuration of the card interface 30 in the host apparatus 20 and the host interface 6 in the memory card 1 during the normal data transfer mode. FIG. 7 shows an example in which the memory card 1 transfers read data to the host apparatus 20. FIG. 7 also shows the connection relationship under which data output by a transmission flip flop 22 is transferred via the data I/O circuits 65 and 34 and then loaded into a reception flip flop 24. Unlike FIGS. 2 and 5, FIG. 7 shows the memory card (host interface 6) 1 on the left and the host apparatus (card interface 30) 20 on the right.

A clock signal generated by the clock generating circuit 31 in the card interface 30 in the host apparatus 20 is supplied to the host interface 6 in the memory card 1 via clock I/O circuits 38 and 69. The clock signal supplied by the host interface 6 has its frequency doubled by the clock generating circuit 21. The resulting clock signal is supplied to a clock terminal of the transmission flip flop 22. The transmission flip flop 22 holds read data input to the input terminal D in the DDR mode and outputs the data from an output terminal Q to the data bus. As seen in FIG. 7, the read data and the clock signal are transmitted in the opposite directions. The data I/O circuit cells 34 and 65 are bidirectional, but FIG. 7 shows only a part in which the data is transmitted from the memory card 1 to the host apparatus 20.

The read data output via the data I/O circuit 65 by the transmission flip flop 22 is supplied to the delay element 23 via the data bus and the data I/O circuit 34 in the host apparatus 20. The delay element 23 eliminates a variation among the data bits of the read data supplied to the delay element 23, which is able to adjust the delay value. The resulting read data is supplied to and held in the reception flip flop 24. If a clock signal generated by the host apparatus 20 is input to the input terminal D of the flip flop terminal 22 and a clock pattern then output to the host apparatus 20 is used to adjust read timings, then the read data passes through the transmission flip flop 22 in the memory card 1 back to the reception flip flop 24 in the host apparatus 20 using the clock signal generated by the host apparatus 20 as a start point. Owing to the large length of the path, the delay in the path varies very significantly. When DRAM or the like using DDR is used, the controller and the memory circuit are arranged onboard, and the wiring between the controller and the memory circuit can be fixed. However, for the SD memory card, the length of an SD bus line and the properties of the element vary depending on the implementations of the host system and the card. This prevents the delay value from being pre-calculated. To correctly receive data, it is necessary to adjust the phase of the clock signal supplied to the flip flop 24 and the phase of the input data so as to provide the appropriate setup and hold time for the flip flop 24. Thus, a phase adjustable delay element 25 needs to be interposed in front of the clock generating circuit 26, which doubles the frequency of the clock signal, to adjust the delay value (phase) of the clock signal supplied to the flip flop 24.

FIG. 8 is a block diagram showing the configuration of the memory card and the host apparatus in accordance with the second embodiment of the present invention. In the second embodiment, description will be given of the memory card and host apparatus having the read timing adjustment mode.

Differences from the configuration shown in FIG. 7 will be shown below. The delay element 27 and the output selecting circuit 35 are connected to the input terminal D of the flip flop 22 in the host interface 6 in the memory card 1. The mode selecting circuit 36 is connected to the output selecting circuit 35. The mode selecting circuit 36 outputs a signal required to set the read timing adjustment mode or the normal operation mode, to the output selecting mode 35. Upon receiving a signal setting the read timing adjustment mode from the mode selecting circuit 36, the output selecting circuit 35 outputs a clock signal generated by the clock generating circuit 31 and supplied to clock I/O circuit 69 to the delay element 27. Further, upon receiving a signal setting the normal operation mode, the output selecting circuit 35 outputs read data to the delay element 27. That is, in the read timing adjustment mode, the output selecting circuit 35 supplies the clock signal to the input terminal D of the transmission flip flop 22 via the delay element 27 to allow a clock pattern to be output onto a data bus.

Moreover, a phase detecting circuit 28 determining the delay value is connected to the delay element 23 interposed in the data bus in the card interface 30 in the host apparatus 20. The mode selecting circuit 61 and the adjustment value holding circuit 62 are connected to the delay element 25. Further, an output from the delay element 23 is supplied to the delay element 25. Upon receiving the signal setting the read timing adjustment mode from the mode selecting circuit 61, the delay element 25 adjusts the phase of a clock signal input to an input section of the delay element 25, that is, a delay value (adjustment value), so that the edge of a clock signal (a first clock signal) generated by the clock generating circuit 31 matches the edge of a clock pattern (a second clock signal) output by the delay element 23. At this time, the determined adjustment value is held in the adjustment value holding circuit 62. Upon receiving the signal setting the normal operation mode from the mode selecting circuit 61, the delay element 25 uses the adjustment value held in the adjustment value holding circuit 62 to adjust a delay value for the clock signal input to the input section of the delay element 25. That is, in the read timing adjustment mode, the clock pattern output by the delay element 23 is supplied to the phase adjustable delay element 25 in order to adjust the setup and hold time for the reception flip flop 24. On the basis of the clock pattern, the delay element 25 adjusts the phase of the clock signal to determine the current adjustment value. Moreover, the determined adjustment value is held in the adjustment value holding circuit 62. Then, in the normal operation mode, the delay element 25 adjusts the delay value for the clock signal in accordance with the adjustment value held in the adjustment value holding circuit 62. This makes it possible to ensure the appropriate setup and hold time for the reception flip flop 24.

In the read timing adjustment mode, the transmission flip flop 22 is supplied with a clock signal of a double frequency. Consequently, such a waveform as shown in FIG. 8 is output onto the data bus. The phase detecting circuit 28 has a function of detecting a phase difference among a plurality of data bits and adjusting the delay element 23 so that the delay values for all the data bits other than the latest one are set on the basis of the delay value for the latest data bit to inhibit a variation in delay among the data bits. The phase adjustable delay element 25 has a function of adjusting the phase of the clock pattern output onto the data bus by the memory card 1 and the phase of the clock signal input to the reception flip flop 24, to particular values.

FIG. 9 is a timing chart showing the case in which the delay element 25 adjusts the clock pattern so as to shift the phase of the clock signal from the phase of the clock pattern by 180 degrees. The signal DAT Delayed shows an adjusted waveform. The rising edge and falling edge of the signal DAT Delayed synchronize with the rising edge and falling edge of the clock pattern DAT on the data bus and indicate data change points on the data bus. The rising edge of the clock signal (CLK×2) supplied to the flip flop 24 is adjusted to the intermediate point between the data change points. This ensures a sufficient setup and hold time for the flip flop 24.

Once the write timing adjustment mode and read timing adjustment mode in accordance with the first and second embodiments are executed, the results are held in the adjustment value holding circuit 62. Further, if the delay may be varied by, for example, a variation in temperature, the adjustment value (delay value) can be readjusted by executing the adjustment mode again periodically or under particular conditions.

The embodiment of the present invention can provide the memory card and host apparatus which are able to stably transfer data even when operating at a high clock frequency.

Further, the above embodiments can not only be individually carried out not but also be appropriately combined. Moreover, each of the above embodiments includes various levels of inventions. The various levels of inventions can thus be extracted by appropriately combining a plurality of the components disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory card accessed by a host apparatus, the memory card comprising:
   a clock input/output circuit which receives a first clock signal from the host apparatus via a clock line;
   a data I/O circuit which receives a second clock signal from the host apparatus via a data line in a write timing adjustment mode executed by the memory card, the data I/O circuit transmitting and receiving data to and from the host apparatus via the data line in a data transfer mode;
   a delay element which, in the write timing adjustment mode, adjusts a phase of the second clock signal output by the data I/O circuit in accordance with the first clock signal so as to receive the data received in the data transfer mode in response to the first clock signal supplied by the clock input/output circuit; and
   an adjustment value holding circuit which holds an adjustment value for the phase of the second clock signal adjusted by the delay element,
   wherein in the data transfer mode, the delay element adjusts a phase of the data output by the data I/O circuit in accordance with the adjustment value held in the adjustment value holding circuit.

2. The memory card according to claim 1, further comprising a flip flop which, in the data transfer mode, holds the data having the phase adjusted by the delay element, in synchronism with the first clock signal.

3. The memory card according to claim 1, wherein the delay element adjusts the phase of the second clock signal so that a setup time and a hold time for an edge of the first clock signal are included in a period from a rising edge to a falling edge of the second clock signal.

4. The memory card according to claim 1, further comprising a clock generating circuit which generates a third clock signal having a frequency which is integer times as large as that of the first clock signal; and
   a flip flop which holds the data having the phase adjusted by the delay element, in synchronism with the third clock signal.

5. The memory card according to claim 1, further comprising a mode selecting circuit which sets one of the data transfer mode and the write timing adjustment mode for the delay element.

6. The memory card according to claim 2, further comprising a nonvolatile semiconductor memory device which stores data output by the flip flop.

7. The memory card according to claim 6, wherein the nonvolatile semiconductor memory device includes a NAND flash memory.

8. A host apparatus accessing a memory card, the host apparatus comprising:
- a clock generating circuit which generates a first clock;
- a clock input/output circuit which supplies the first clock signal to the memory card via a clock line;
- a data I/O circuit which receives a second clock signal generated on the basis of the first clock signal, from the memory card via a data line in a read timing adjustment mode executed by the host apparatus, the data I/O circuit transmitting and receiving data to and from the memory card via the data line in a data transfer mode;
- a first delay element which, in the read timing adjustment mode, adjusts a phase of the first clock signal in accordance with the second clock signal output by the data I/O circuit; and
- an adjustment value holding circuit which holds an adjustment value for a phase of the first clock signal adjusted by the first delay element,
- wherein in the data transfer mode, the first delay element adjusts the phase of the first clock generated by the clock generating circuit in accordance with the adjustment value held in the adjustment value holding circuit.

9. The host apparatus according to claim 8, further comprising a flip flop which, in the data transfer mode, holds the data output by the data I/O circuit, in synchronism with the first clock signal adjusted by the first delay element.

10. The host apparatus according to claim 8, wherein the first delay element adjusts the phase of the first clock signal so that a setup time and a hold time for an edge of the first clock signal are included in a period from a rising edge to a falling edge of the second clock signal.

11. The host apparatus according to claim 8, further comprising a phase detecting circuit which detects a phase difference in the second clock signal output by the data I/O circuit; and
- a second delay element which adjusts the phase of the second clock signal in accordance with the phase difference detected by the phase detecting circuit.

12. The host apparatus according to claim 8, further comprising a clock generating circuit which generates a third clock signal having a frequency which is integer times as large as that of the first clock signal having the phase adjusted by the first delay element; and
- a flip flop which holds the data output by the data I/O circuit, in synchronism with the third clock signal.

13. The host apparatus according to claim 8, further comprising a mode selecting circuit which sets one of the data transfer mode and the write timing adjustment mode for the first delay element.

* * * * *